United States Patent [19]

Legal

[11] Patent Number: 5,736,850
[45] Date of Patent: Apr. 7, 1998

[54] CONFIGURABLE PROBE CARD FOR AUTOMATIC TEST EQUIPMENT

[75] Inventor: Dennis Andrew Legal, Westlake Village, Calif.

[73] Assignee: Teradyne, Inc., Boston, Mass.

[21] Appl. No.: 526,302

[22] Filed: Sep. 11, 1995

[51] Int. Cl.$^6$ .................................................. G01R 31/02
[52] U.S. Cl. .................................. 324/158.1; 324/754
[58] Field of Search ............................ 324/754, 72.5, 324/158.1, 765

[56] References Cited

U.S. PATENT DOCUMENTS

| | | | |
|---|---|---|---|
| 3,493,858 | 2/1970 | Baron et al. | 324/72.5 |
| 4,500,836 | 2/1985 | Staudacher | 324/754 |
| 4,517,512 | 5/1985 | Petrich et al. | 324/754 |
| 5,055,780 | 10/1991 | Takagi et al. | 324/765 |
| 5,070,297 | 12/1991 | Kwon et al. | 324/754 |
| 5,506,510 | 4/1996 | Blumenau | 324/754 |

*Primary Examiner*—Ernest F. Karlsen
*Assistant Examiner*—Anh Phung
*Attorney, Agent, or Firm*—Edmund J. Walsh

[57] ABSTRACT

A configurable probe card for use with a tester for semiconductor devices. The probe is configurable so that the contact pattern during each touch down can be different. In this way, the number of devices being tested simultaneously can be maximized. The configurable probe card increases the utilization of the tester, thereby allowing increased throughput in the semiconductor manufacturing process or, alternatively, decreasing the overall cost of testing each device.

11 Claims, 4 Drawing Sheets

CONFIGURABLE PROBE CARD FOR AUTOMATIC TEST EQUIPMENT

This invention relates generally to automatic test equipment and more specifically to automatic test equipment used in the testing of semiconductor devices.

Semiconductor devices are generally tested at least once during their manufacture. Testing is used to identify and eliminate faulty components as early as possible during the manufacturing process. In this way, the cost of processing faulty parts is significantly reduced.

Semiconductor devices contain a die or "chip" of semiconductor material and some packaging material to provide mechanical support for the die and to allow electrical connections to be made to the die. Because the cost of packaging is relatively high, it is desirable that any defective dies be sorted out before packaging.

The semiconductor dies are generally made on silicon wafers. Wafers used today are typically 8 inches in diameter, though 12 inch diameter wafers are under development and are expected to be available soon. Many semiconductor dies are formed on a single wafer. The exact number depends on the size of the wafer and the size of the die, though several hundred to over a thousand die might be formed on one wafer. Testing of the dies is generally performed while they are still a part of the wafer.

Testing of semiconductor components is typically accomplished using very powerful automatic test equipment. The test equipment, called generally a "tester," is capable of generating numerous test signals and measuring responses. The generated signals are precisely controlled and the responses are very accurately measured. In this way, the tester can make a very accurate determination of whether a semiconductor die is functioning properly. Examples of such testers are the J995 and the J971 sold by Teradyne, Inc. of Agoura Hills, Calif., USA.

To test dies still on a wafer, a mechanism to make electrical contact to the individual dies must be used. A typical arrangement includes a probe card. Generally, the probe card has numerous individual probe wires in a pattern designed to make contact with contact pads on the die. However, other contact mechanisms are used in probe cards to make contact to many points. For example, some probe cards use flexible membranes with conductive portions on them which are pushed down onto the die.

The probe card is connected to a test head. The test head contains electronic circuitry to drive test signals and receive responses. To achieve high testing accuracy, it is necessary that this driver/receiver circuitry be as close as possible to the semiconductor die being tested. For that reason, it is often placed in a test head, allowing it to be separated from other electronic circuitry in the tester and placed closer to the semiconductor device.

During testing, the wafer is held in a device called prober. The prober is attached to the test head. The prober moves the wafer around to present different dies to the probe card. The tester runs through a test program to test the die presented to it. This test program is repeated each time a die is presented to the tester. In this way, every die on the wafer can be tested.

In some instances, one die is tested at a time. However, all of the dies on a wafer are usually the same. It is therefore possible that multiple dies be tested at one time with one run through the test program in the tester. When multiple dies are tested simultaneously, the probe wires on the probe card are divided into test "sites." Each site includes the probe wires for one die. The signals provided for each site are the same.

Testers for semiconductor memories are often configured with multiple sites. Thirty-two test sites in a tester is not uncommon in a memory tester. There must be separate driver and/or receiver ("driver/receiver") circuitry for each signal probe wire in each site, but other circuitry in the tester can be used to generate signals for multiple test sites. In this way, the cost of the test equipment on a per wafer basis is reduced. Also, the throughput of the test equipment can be increased.

Probe card technology is lagging slightly behind tester technology. Current probe cards generally test a maximum of sixteen sites at once, but larger probe cards are becoming available.

Throughput is very important in semiconductor processing for two reasons. First, the cost of the processing equipment is very high. On the other hand, semiconductor components sell for a relatively low price. Therefore, semiconductor manufacturers must be able to amortize the high cost of processing equipment over a very large number of semiconductor devices processed by that equipment. Second, semiconductor components must be manufactured in clean rooms so that dust or other contaminants not ruin the semiconductor components. Clean rooms are expensive to build and generally have limited floor space. The amount of equipment that can be placed in a clean room is limited. Therefore, each piece of equipment must process many semiconductor devices.

SUMMARY OF THE INVENTION

With the foregoing background in mind, it is an object of the invention to increase the throughput of a tester having multiple test sites.

It is also an object to reduce the cost of testing semiconductor memory chips.

The foregoing and other objects are achieved in a tester having a configurable probe card. The tester generates signals for multiple test sites. The probe card contains probe wires or other contact mechanisms for multiple test sites. However, the probe card has contact mechanisms for more test sites than the tester can generate signals for. A switch array is placed between the tester circuitry and the contact points to change which of the test sites on the probe card are connected to the tester circuitry.

In operation, the switch array is used to select different configurations of test sites on the probe card. The configurations for successive runs of the test program are selected based on the position on the wafer of the dies being tested. In this way, the total number of test runs is reduced and throughput increases.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1C:
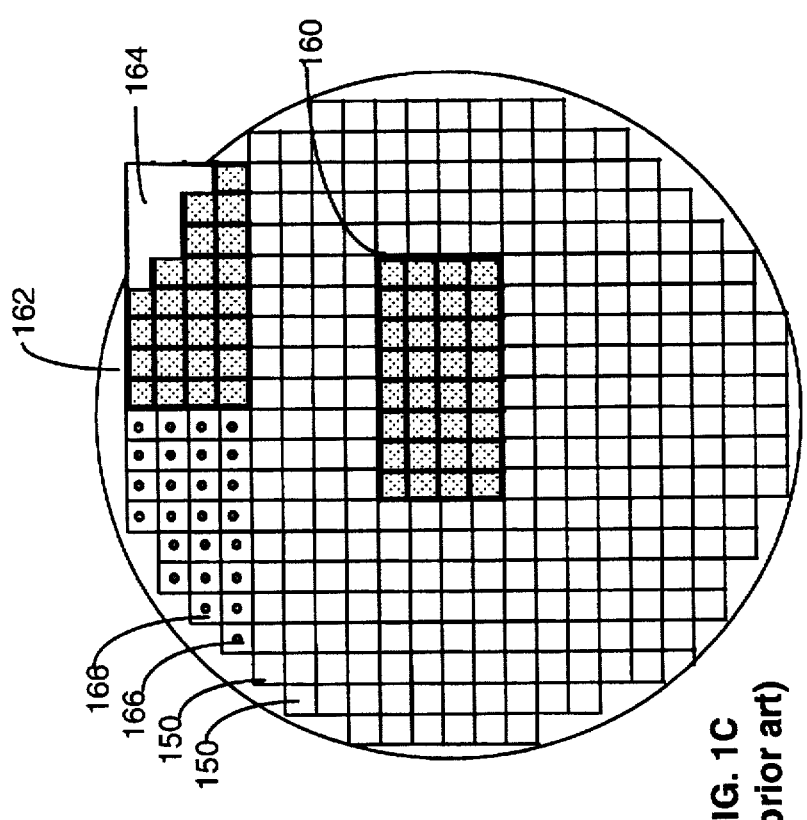
FIG. 1C is a sketch illustrating how multiple test sites of the prior art system of FIG. 1A might be used to test multiple dies on the wafer shown in FIG. 1B.
Figures 1A, 1B:
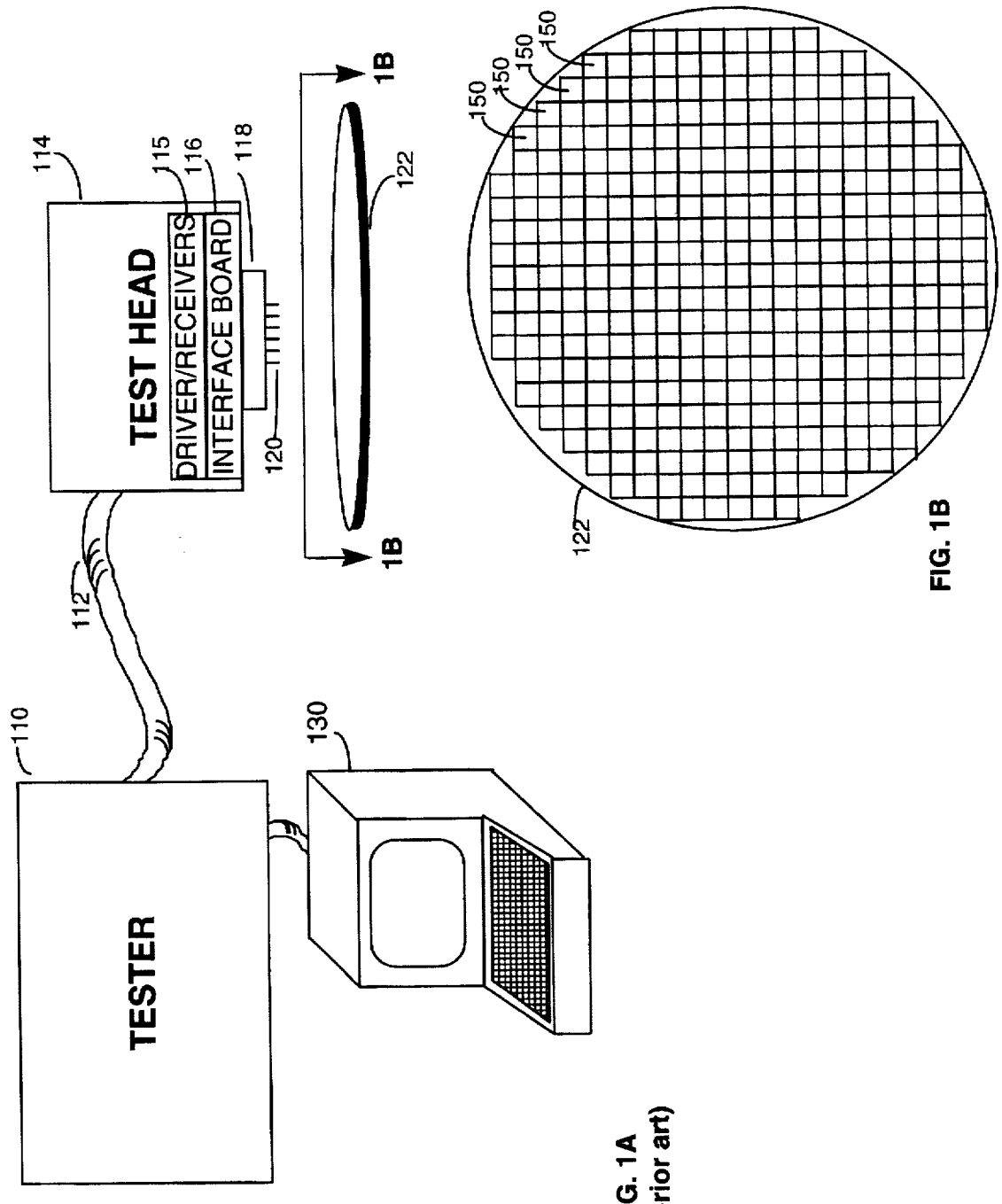
FIG. 1A is sketch illustrating a prior art test set up.
FIG. 1B is a sketch illustrating the surface of a semiconductor wafer.

FIG. 1A shows a tester main frame 110 as in the prior art. The tester main frame 110 contains the circuitry and software programming which specifies test signals and expected results.

A test head 114 is connected to the tester main frame 110. Here, the connection is shown to be made through a cable 112. Such a configuration is shown as representative of the art. However, testers exist in which the test head is incorporated into the same physical structure as the tester main frame. The exact configuration is not important to the invention.

Test head 114 contains numerous drivers and receivers 115. There is generally one driver/receiver for each signal to be generated or measured.

The driver/receivers are connected through interface board 116 to probe card 118. Interface board 116 provides a convenient means for mechanical interconnection and might also contain some components for signal conditioning or other functions. The exact interconnection of the driver/receivers 115 to probe card 118 is not important to the invention.

Probe card 118 contains numerous probe wires 120 which are grouped into a plurality of identical test sites. The probe wires in each test site 120 make contact to one die on wafer 122. In the example given herein, there are 32 test sites.

Probe card 118 can be a specially manufactured printed circuit type board with physical wire type probes extending from it. However, as used herein, the term "probe card" is not limited to a printed circuit board. It is intended to encompass any structure used to hold conductive probes. Likewise, the term "probe wires" is not limited to a wire. It is intended to encompass any method of making electrical connection to multiple individual spots on a die, such as a conductive membrane.

Probe wires make contact with die on a wafer 122. As described above, the wafer is held and positioned in a prober, which is not shown.

FIG. 1B shows the surface of wafer 122. There are numerous dies 150 on the surface of wafer 122. During one pass through the test program, the probe wires (120, FIG. 1) of the tester will make contact with several of the dies 150. In the case where there are 32 test sites, the probe wires can make contact with up to thirty-two dies.

FIG. 1C shows a contact pattern 160 in which 32 dies within the contact pattern are simultaneously contacted. Contact pattern 160 is in the center of the wafer.

However, FIG. 1C also shows a contact pattern 162 in which only twenty-four dies are simultaneously contacted. The sites in region 164 do not contact any dies 150 on wafer 122 because they extend beyond the edge of wafer 122.

To test all of the cells in the top four rows of wafer 122, a second pass through the test program is necessary. The dies 166 marked with a circle are tested in this second pass. There are 25 such dies in the second pass.

We have recognized that the configuration of the test sites on probe card 118 limits the throughput of the test process. In particular, in two passes through the test program, only a total of fifty-one dies can be tested. The tester is, however, capable of generating test signals for sixty-four dies. Therefore, the tester is only about 80% utilized in those two passes. Stated another way, the tester could have tested 20% more parts in the same time. Providing a tester with a much greater utilization would increase the throughput of the manufacturing operation.

Figure 2B:
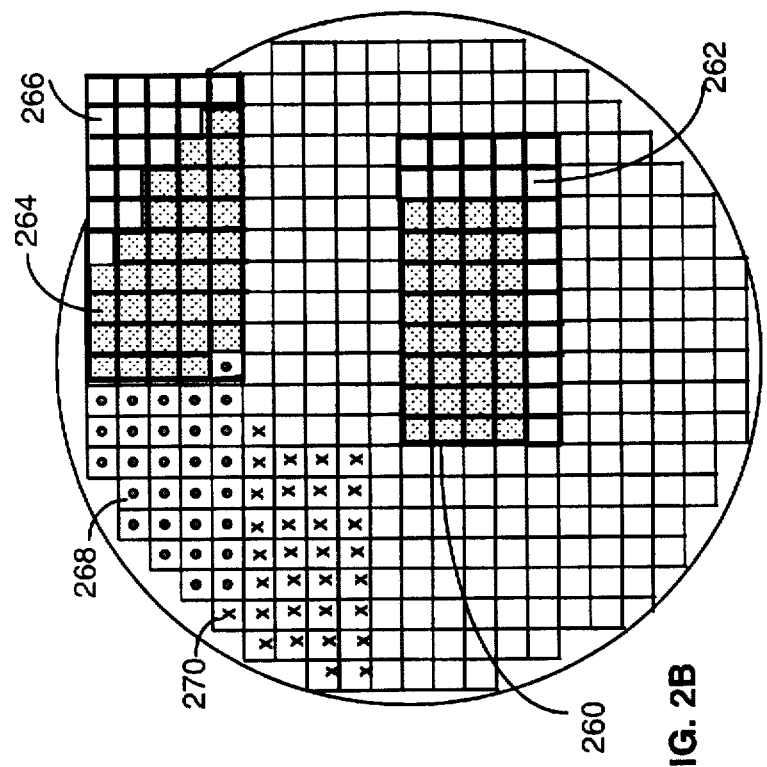
FIG. 2B is a sketch illustrating how multiple test sites of the invention of FIG. 2A might be used to test multiple dies on the wafer shown in FIG. 1B.
Figure 2A:
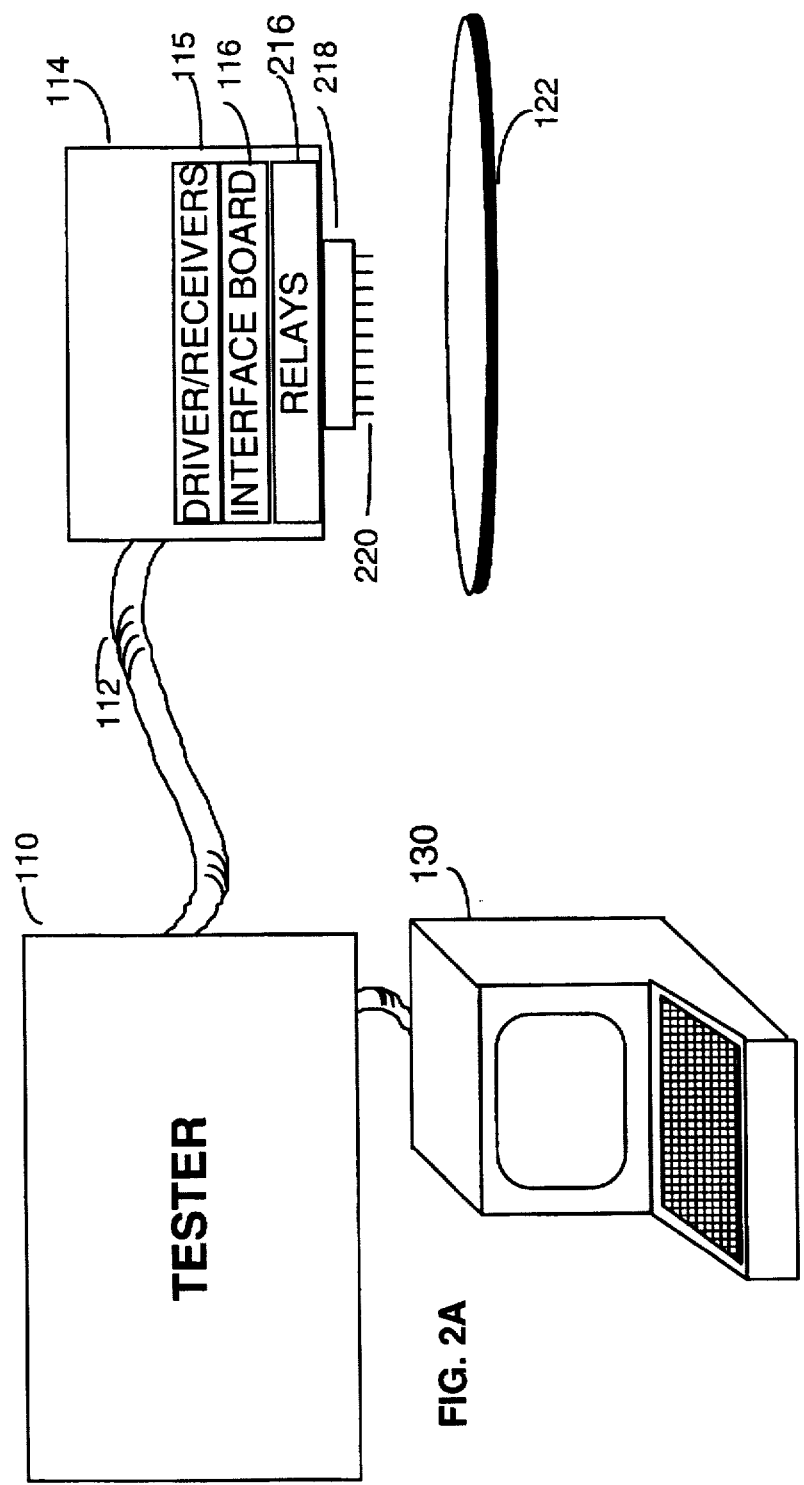
FIG. 2A is a sketch illustrating a test set up according to the invention.

FIG. 2A shows an adaptation to the test system which would allow greater utilization of the tester. In place of probe card 118, probe card 218 is used. Probe card 218 has more probe wires 220 than probe card 118. The probe wires are organized into more test sites. For the examples given herein, probe card 218 contains fifty test sites.

However, tester 110 is capable of generating test signals for fewer test sites. Some or all of the test sites on probe card 218 are connected to tester 110 through relay matrix 216. In this way, for each pass through the test program, the pattern of test sites can be different. This flexibility allows greater utilization of the tester.

FIG. 2B shows a contact pattern 260. Contact pattern 260 is in the center of wafer 122. It has thirty-two active test sites, just like contact pattern 160 (FIG. 1C). Contact pattern 260 also includes eighteen test sites in region 262. Because tester 110 is only capable of generating test signals for thirty-two test sites, the test sites on probe card 218 in region 262 do not provide test signals. They are inactive and are not connected to tester 110 through relays 216.

The advantage of the invention is apparent from contact pattern 264. Contact pattern 264 is at the edge of a wafer 122. Nonetheless, thirty-two test sites are active in contact pattern 264. Eighteen test sites in region 266 are inactive. However, tester 110 is fully utilized generating test signals for the test sites in contact region 264. Therefore, there is no loss in tester utilization.

A second pass through the test program can be used to test the dies 268 marked with circles. Again, thirty-two dies are tested in the second pass, fully utilizing the tester. In a third pass, thirty-two dies 270 marked with an X can be tested, again fully utilizing the tester.

In each case, the pattern of active test sites in patterns 264, 268 and 270 is slightly different. Thus, it is said that probe card 218 is "configurable." The total number of test sites on card 218 is fixed, but the ones used at any pass through the test program can be different to get maximum utilization of tester 110. The active test sites are selected through activation of specific relays 216.

Figure 3:
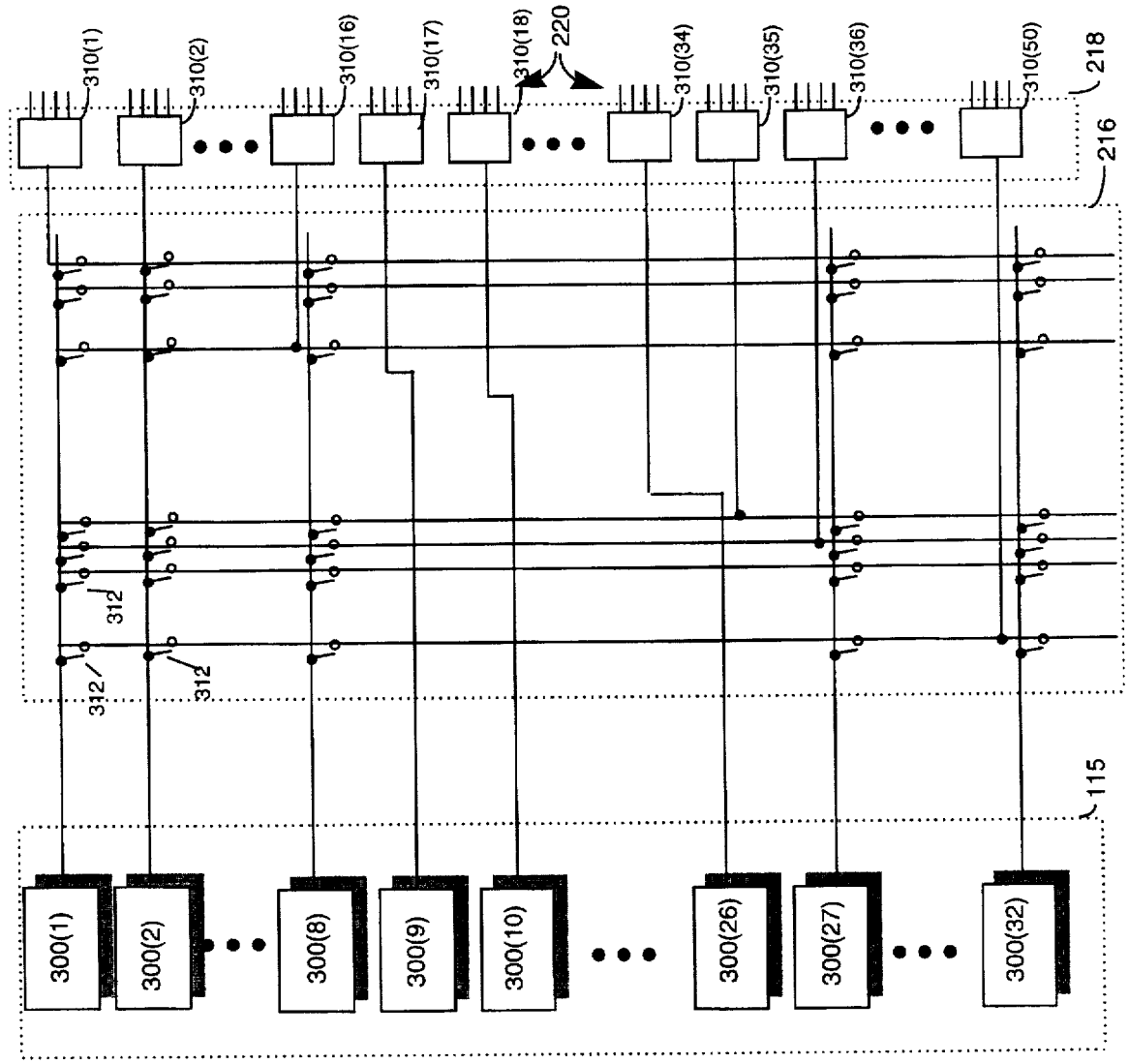
FIG. 3 is a schematic diagram showing greater detail of a preferred configuration of the relays of the invention.

FIG. 3 shows the circuitry in test head 114 in greater detail. Driver/receiver board 115 is shown to contain thirty-two groups of driver/receiver circuits 300(1) ... 300(32). Each of the groups 300(1) ... 300(32) contains the drivers and receivers needed to generate test signals for one of the test sites 310(1) ... 310(50).

Interface board 116 is not explicitly shown in FIG. 3, as this board provides largely mechanical interfacing and does not affect the signal flow shown in FIG. 3.

Relay board 216 contains a plurality of relays 312. Each of the relays 312 can be actuated to connect one of the groups of driver receivers to one of the test sites. It will be appreciated that each of the test sites contains a plurality of probe wires. Thus, to switch a group of driver/receiver circuits to a test site, a plurality of connections must be made. Thus, relays 312 actually represent a plurality of relays in parallel, providing independent signal paths for each of the probe wires 220 in a test site.

Relays 312 may be traditional mechanical type relays. Alternatively, they could be solid state switches or other similar structure. Such relays or switches have control inputs, which are not shown in FIG. 3 for clarity. However, the control inputs to relays 312 are connected back through cable 112 to computer 130. As in the prior art, computer 130 controls the overall test process, including the interaction between tester 110 and the prober holding wafer 122. Thus, computer 130 is programmed to actuate appropriate ones of the relays 312 to provide the desired contact pattern for each pass through the test program in tester 110.

In the embodiment of FIG. 3, only some groups of driver/receiver circuits are connected to test sites through relays 312. Groups 300(9) ... 300(26) are wired directly to test sites 310(17) ... 310(34). Test sites 310(17) ... 310(34) are preferably in the center of probe card 218. The remaining test sites, 310(1) ... 310(16) and 310(36) ... 310(50), can be connected to one of the remaining groups 300(1) ... 300(8) or 300(27) ... 300(32).

Having a portion of the test sites wired directly to groups of driver/receiver circuits slightly reduces the number of contact patterns which are possible. However, as some of the test sites in the center of probe card 220 must be active if there are to be thirty-two active test sites, this restriction is not significant. This restriction provides the benefit of reducing the total number of relays 312 required.

The number of test sites connected to groups of driver/receiver circuits through relays 312 is not important to the invention. All or some fraction of the test sites might be connected through the relays.

In use, a probe card will be made for each type of device that must be tested since each device requires its own layout of probe wires. For that reason, test head 114 is made to accept many different sizes and configurations of probe cards.

The size of the configurable probe card may also be different for different types of devices. The size and shape of the configurable probe card are selected to give high tester utilization without unnecessarily increasing cost. The required size and shape will depend of the layout of dies 150 on wafer 122. For example, one layout might achieve a very high utilization with a configurable probe card having 40 test sites arranged in a 5×8 rectangular array. To test devices on such a wafer, a 5×8 rectangular array might be adequate. As another example, a wafer with a different layout might result in an unacceptable utilization with the 40 site probe card. On the other hand, that wafer might achieve a very high utilization with a fifty site probe card, with the sites arranged in a 5×10 array. Such a probe card would preferably be used to test that wafer.

In situations where a probe card with fewer test sites can be used while still achieving the same, or almost the same, utilization as a larger probe card, the smaller probe card would be preferred. The smaller probe card would be less expensive and therefore more desirable.

In a factory where semiconductor devices are manufactured, a specific tester 110 is usually dedicated to test a certain type of components for an extended period of time. The tester and associated test head, computer and prober are configured for that type of device. As part of that configuration process, the size and configuration of the probe card would be selected. Also, the contact pattern for the active test sites would be selected for each pass through the test program. One pass through the test program is sometimes called a "touchdown" because, for each pass through the test program the wafer 122 is brought into contact with probe wires 220.

The contact size and configuration of the probe card might be determined by a computer program running on computer 130 or some other computer, which need not be connected to tester 110. Such a program would accept as inputs the layout of dies 150 on wafer 122 and the total number of active test sites test head 114 could support. For various size configurable probe cards, the computer program would try various contact patterns at different touchdowns and construct a set of contact patterns which allowed each die 150 to be tested. For each size of configurable probe card, the set of contact patterns which required the minimum number of touchdowns would be saved.

This processing would be repeated for each size of configurable probe card. The smallest configurable probe card which resulted in adequate tester utilization would be selected. The selected contact pattern for each touchdown would be saved for use by computer 130 in controlling relays 312 during various passes through the test program.

In this way, high tester utilization is achieved with relatively modest added cost. More devices can be tested in a fixed period of time, thereby reducing the total cost of testing the components.

Having described one embodiment, numerous alternative embodiments or variations might be made. For example, the configurable probe cards were described to be rectangular arrays of test sites. No such configuration is necessary. For some wafers, more efficient utilization might be obtained by staggering the number of test sites in each row to match the layout of dies near the edge of the wafer.

Also, it was described that control inputs for relays 312 were provided from computer 130. The control inputs might come from any computer involved in the testing operation. For example, probers generally have computers which could generate the required control signals.

Also, it was described that relays 312 are included on a separate board. The relays could be included as part of interface board 116. Alternatively, the relays might be included on driver/receiver boards 115. As another variation, it is not necessary that the relays be inserted into test head 114, though such an arrangement is desirable because it allows the relays to be placed near both driver receivers 115 and the devices under test.

As another example of possible variations, it should be noted that the switching array of FIG. 3 is illustrative only. A full switching matrix could be used to allow any test site to be connected to any group of driver/receiver circuits. Alternatively, certain driver/receiver circuits might be switched to only one of a few test sites. The exact switching arrangement is preferably selected to use as few relays as possible to generate all required contact patterns.

Therefore, the invention should be limited only by the spirit and scope of the appended claims.

What is claimed is:

1. Automatic test equipment for use in testing semiconductor components on a wafer, each wafer containing a plurality of dies disposed in a predetermined pattern, comprising:

a) a first plurality of groups of test signal circuits, each group of test signal circuits for driving and receiving test signals for one die on the wafer;

b) a contact device having a second plurality of groups of contact points, each group of contact points for contacting test points on one die on the wafer, the second plurality being larger than the first plurality; and c) a matrix of a third plurality of switchable elements connected between the first plurality of groups of test signal circuits and the second plurality of groups of contact points, each switchable element connecting one of the groups of test signal circuits to one of the groups of contact points contacting test points on the plurality of dies disposed in the predetermined pattern.

2. The automatic test equipment of claim 1 wherein the contact device comprises a probe card.

3. The automatic test equipment of claim 1 additionally comprising a test head, wherein the first plurality of groups of test signal circuits comprise driver/receiver circuits in the test head.

4. The automatic test equipment of claim 3 wherein the matrix of switchable elements is located within the test head.

5. The automatic test equipment of claim 1 wherein the third plurality is less than the first plurality and the automatic test equipment additionally comprises signal paths between a portion of the first plurality of groups of test signal circuits and a portion of the second plurality of groups of contact points, such paths being separate from the switchable elements.

6. The automatic test equipment of claim 1 additionally comprising means for actuating selected ones of the switchable elements while dies on the wafer are being tested, thereby configuring the contact device such that the groups of contact points contact test points on other pluralities of dies disposed in different predetermined patterns.

7. The automatic test apparatus of claim 6 wherein the means for actuating comprises a computer work station connected to the automatic test equipment.

8. A process for manufacturing semiconductor components including a step of testing the components while on a semiconductor wafer, the step of testing comprising the steps of:

a) connecting a first set of test sites on a probing device to electronic circuitry for generating and receiving test signals;

b) bringing the probing device and the semiconductor wafer into contact such that the first set of test sites contacts a first plurality of components on the semiconductor wafer;

c) testing the first plurality of components on the wafer;

d) connecting the electronic circuitry to a second set of test sites on the probing device, at least a portion of the test sites in the second set not being in the first set; and e) bringing the probing device and the semiconductor wafer into contact such that the second set of test sites contacts a second plurality of components on the semiconductor wafer; and f) testing the second plurality of components on the wafer, wherein the electronic circuitry is only capable of generating and receiving test signals for less than the total number of test sites in the first set and the second set.

9. The process of claim 8 wherein the first plurality of components is different from the second plurality of components.

10. The process of claim 8 wherein the semiconductor components are semiconductor memories.

11. The process of claim 8 wherein the steps of connecting comprise actuating switches to connect a first plurality of circuits, each of the circuits generating test signals to test a semiconductor component, to selected ones of a second plurality of test sites in the probing device, the second plurality being larger than the first plurality.

* * * * *